(12) United States Patent
Steudel et al.

(10) Patent No.: US 10,331,201 B2
(45) Date of Patent: Jun. 25, 2019

(54) POWER CONTROL IN INTEGRATED CIRCUITS

(71) Applicant: IMEC VZW, Leuven (BE)

(72) Inventors: Soeren Steudel, Oud-Heverlee (BE); Liesbet Van der Perre, Kessel-Lo (BE); Bruno Mollekens, Boortmeerbeek (BE)

(73) Assignee: IMEC VZW, Leuven (BE)

( * ) Notice: Subject to any disclaimer, the term of this patent is extended or adjusted under 35 U.S.C. 154(b) by 167 days.

(21) Appl. No.: 15/652,737

(22) Filed: Jul. 18, 2017

(65) Prior Publication Data
US 2018/0024618 A1 Jan. 25, 2018

(30) Foreign Application Priority Data

Jul. 20, 2016 (EP) .................................. 16180391

(51) Int. Cl.
*G06F 1/32* (2019.01)
*G06F 1/3287* (2019.01)
*G06F 1/3234* (2019.01)
*G06F 1/3296* (2019.01)
*H01L 23/525* (2006.01)
*H01L 27/12* (2006.01)
*H03K 17/687* (2006.01)

(52) U.S. Cl.
CPC .......... *G06F 1/3287* (2013.01); *G06F 1/3243* (2013.01); *G06F 1/3296* (2013.01); *H01L 23/525* (2013.01); *H01L 27/12* (2013.01); *H03K 17/687* (2013.01)

(58) Field of Classification Search
None
See application file for complete search history.

(56) References Cited

U.S. PATENT DOCUMENTS

| 9,520,876 B1 * | 12/2016 | Chadwick .......... H03K 19/0016 |
| 2003/0052730 A1 * | 3/2003 | Hoshi ....................... G06F 1/32 327/544 |
| 2010/0220527 A1 * | 9/2010 | Norman ................... G11C 8/16 365/185.05 |

FOREIGN PATENT DOCUMENTS

EP 2 884 542 A2 6/2015

* cited by examiner

*Primary Examiner* — Paul Yen
(74) *Attorney, Agent, or Firm* — McDonnell Boehnen Hulbert & Berghoff LLP

(57) ABSTRACT

An integrated circuit device comprising a power control unit for controlling the power of a power isle is disclosed. The power control unit comprises (i) a power gating switch implemented in the BEOL portion for switching ON/OFF the power to the power isle, (ii) a state recovery circuit comprising a memory element in the FEOL portion or BEOL portion and a transistor configuration in the BEOL portion, and (iii) a wake-up/sleep circuit in the BEOL portion adapted for receiving an identifier. The wake-up/sleep circuit is operatively connected with the power gating switch and with the state recovery circuit. Responsive to receiving the identifier, the wake-up/sleep circuit causes the power gating switch to switch OFF/ON the supply power to the power isle and causes the state recovery circuit to store/restore the state of the power isle.

20 Claims, 5 Drawing Sheets

POWER CONTROL IN INTEGRATED CIRCUITS

CROSS-REFERENCE TO RELATED APPLICATION

The present application is a non-provisional patent application claiming priority to European Patent Application No. 16180391.1 filed Jul. 20, 2016, the contents of which are hereby incorporated by reference.

TECHNICAL FIELD

The present disclosure relates to the field of integrated circuits. More specifically it relates to power control of such integrated circuits.

BACKGROUND

Lowering the power consumption and increasing the overall power efficiency is one of the top priorities for the semiconductor industry. There are many parallel paths that the industry is following up on (e.g., lowering the power supply voltage with decreasing node, adjustable supply voltage depending on the usage, subthreshold computing, and power gating).

Power gating is an established practice in system on chip (SoC) design. It refers to the application of switches in an integrated circuit (IC) design. These switches may be configured to switch OFF the current to parts of the IC in order to save power. FIG. 1 shows an integrated circuit comprising different units (e.g., µcore unit 110 and memory unit 120) implemented in the front-end-of-line (FEOL) portion of the IC. FIG. 1 also shows a power gating switch 130 that allows switching OFF one or more of the units in the IC. A plurality of power gating switches may allow obtaining a distributed power gating. Such a combination of units that can be switched OFF separately is also referred to as a power isle. In some examples, FEOL transistors at the periphery of the SoC may be used to switch OFF power isles containing a large number of transistors, for instance at least $10^5$ transistors. Switching OFF a power isle of the IC during its idle time may reduce the static power consumption, which may be caused by leakage of such a power isle.

European Patent App. No. EP2884542 discloses an IC device with a power gate transistor implemented in the back end of line (BEOL) to reduce static power consumption.

In some examples, power gating may result in significant energy savings; however, only on the condition that the usage frequency is low (e.g., in a mobile SoC with usage frequency of less than 5%) and on the condition that the idle times are significantly longer than the time required to power up the power isles.

SUMMARY OF THE DISCLOSURE

Example embodiments of the present disclosure may provide an integrated circuit device with an integrated power control unit for controlling the power of a power isle.

The example embodiments may include a method and device according to the present disclosure.

Embodiments of the present disclosure relate to an integrated circuit device comprising a front-end-of-line portion and a back-end-of-line portion, the integrated circuit device comprising a power control unit for controlling the power of a power isle in the front-end-of-line portion. The power control unit comprises: a) a power gating switch implemented in the back-end-of-line portion for switching ON or OFF the power to the power isle; b) a state recovery circuit, adapted for storing and restoring the state of the power isle, and comprising at least one memory element implemented in the front-end-of-line portion or back-end-of-line portion and a transistor configuration in the back-end-of-line portion; and c) a wake-up/sleep circuit implemented in the back-end-of-line portion adapted for receiving an identifier, wherein the wake-up/sleep circuit is operatively connected with the power gating switch and with the state recovery circuit. The power gating switch is adapted for switching OFF the supply voltage to the power isle and the state recovery circuit is adapted for storing the state of the power isle upon reception of a distinct identifier, and the power gating switch is adapted for switching ON the supply voltage to the power isle and the state recovery circuit is adapted for restoring the state of the power isle upon reception of another or the same distinct identifier.

In example embodiments of the present disclosure, the wake-up/sleep circuit may enable switching ON/OFF the power isle, thereby restoring/remembering the state of the power isle upon reception of a distinct identifier. This may allow remotely controlling the power of a power island. This control can, for example, emanate from a power management module and/or from a neighboring power isle. In example embodiments of the present disclosure, a power isle may comprise a power control unit.

In example embodiments of the present disclosure, the size of the power isles can be smaller because the power gating switch, part of the state recovery circuit, and the wake-up/sleep circuit may be implemented in the BEOL portion as opposed to in the FEOL portion. When, for example, a power gating switch is implemented in the FEOL portion, the area of the interconnect tree to connect the power gating switch to the power rail (top level of the BEOL portion, this can for example be metallization level M10-M12) may be larger than if the power gating switch would be implemented in the BEOL portion (for example in an intermediate metallization level M3-M12). When the power gating switch is implemented in the BEOL portion, it is on top of other transistors in the FEOL portion, and therefore the area consumption may not matter. Hence, in example embodiments of the present disclosure, smaller power isles can be switched OFF. Moreover, the area loss caused by going multiple times through the full interconnect tree, which is present in examples where the power gating switch is implemented in the FEOL, is not as high in embodiments of the present disclosure where the power gating switch, at least part of the state recovery circuit, and the wake-up/sleep circuit are implemented in the BEOL. In example embodiments of the present disclosure that use BEOL thin-film transistors (TFTs) for the power control unit, when metal-oxide TFTs based on IGZO (Indium, Gallium, Zinc, Oxide) are used, the OFF current $I_{off}$ may be limited (e.g., to $10^{-23}$ A/um or less).

In example embodiments of the present disclosure, the number of clock cycles required to restore a former state may be reduced, compared to other examples where the number of clock cycles is determined by the access to an embedded memory (SRAM, NVM) or external memory. In example embodiments of the present disclosure, the moment the power isle is switched ON again, the minimum time to transfer the state may depend on the delay of the selected technology and the selected system clock speeds. This may, for example, be in less than 2 clock cycles or even in half a clock cycle.

In example embodiments of the present disclosure, the time and energy to power up again may be reduced by introducing the wake-up/sleep circuit and the state recovery circuit. This may permit a more universal use of fine-grained power isles for even shorter idle periods. The minimum grain size may, for example, depend on how easy it is to decide when which power isle needs to be turned OFF. When, for example, comparing a pipeline architecture with a complex processor structure, it can be appreciated that for the pipeline architecture where a packet of data only flows once through a long chain of building blocks, it may be easy to address a block, and power isles as small as a pipeline stage are possible. Whereas, for a complex processor structure, larger power isles may be required. With an increasing number of power isles, for which the state is recovered, also the number of bits of the distinct identifier may increase. In example embodiments of the present disclosure, the grain size of a power isle may, for example, be above 1000 gates. Using fine-grained power isles may, for example, allow for, during operations like multiplying a number, switching OFF adders that are not in the critical path without loss of energy or without additional delay. Therefore, the energy consumption per bit can be reduced. In example embodiments of the present disclosure, the absolute power consumption for mobile systems on chip, or the power density per bit of a regular system on chip, can be lowered. In example embodiments of the present disclosure, the state of a power island can be maintained when it is powered OFF. As such, in example embodiments of the present disclosure, there may be no penalty in delay and energy consumption when powering ON the power islands. This may allow more universal use of fine-grained power isles for even shorter idle periods.

In example embodiments of the present disclosure, the transistor configuration in the back-end-of-line portion may be connected with the memory element such that the transistor configuration can reduce the current leakage through the memory element.

In example embodiments of the present disclosure, the current leakage through the memory element can be reduced by a transistor configuration in the BEOL portion. The memory element may comprise flip-flops, and every state that needs to be memorized may be implemented in a flip-flop in the FEOL located in the power isle. The transistor configuration in the BEOL portion can, for example, comprise a TFT transistor. This may allow for a low OFF current. Therefore, in example embodiments of the present disclosure, the memorized state can be sustained longer than memory embodiments in the FEOL. This is due to the very low leakage currents that can be obtained in BEOL transistors (e.g., $10^{-23}$ A/um for IGZO transistors). When the leakage through the dielectric of the capacitors is also very low, a state can be present for several months.

In example embodiments of the present disclosure, the back-end-of-line portion may comprise metallization layers, and the power gating switch may be a thin film transistor in between the metallization layers of the back-end-of-line portion.

In example embodiments of the present disclosure, the TFT in the BEOL may have a low OFF current.

In example embodiments of the present disclosure, the power gating switch may be a thin film transistor implemented above the $3^{rd}$ metallization layer of the back-end-of-line portion when starting to count the metallization layers from the front-end-of-line portion.

In example embodiments of the present disclosure, a power isle covering a sub-circuit (e.g., 100-10000 FEOL transistors, which may, for instance, be an adder, an arithmetic-logic unit (ALU), etc.), which may be a design library instance and may, for example, extend into the first, the second, and the third metallization layer, can be switched OFF as a whole by the power gating TFT.

In example embodiments of the present disclosure, the at least one memory element of the state recovery circuit may include a flip-flop comprising front-end-of-line transistors in the power isle, and the transistor configuration in the back-end-of-line portion may be a thin film transistor directly on top of the flip-flop.

In example embodiments of the present disclosure, area loss may be prevented or reduced by placing the TFT directly on top of the flip-flop. The close connection with the front end may ease the integration and may provide improved speed and power metrics. This can, for example, be below the fourth metallization layer. Moreover, this may allow a compact design block for the flip-flop and TFT including routing the flip-flop and TFT with the smallest footprint. This is because in the lower metallization layers (e.g., M1, M2, and M3) the transistors may be realized with a high resolution (similar to the resolution in FEOL). Hence, a small footprint can be obtained. Therefore, in some embodiments, the state recovery circuit may be implemented below the tenth metallization layer or even below the fourth metallization layer. Above the tenth metallization layer, the realization of the state recovery circuit may become less efficient and slower. In example embodiments of the present disclosure, the control unit of every power isle that should have its state recovered may comprise at least one flip-flop, and every flip-flop may comprise at least one BEOL TFT with a capacitor at the gate that stores the state, like in DRAM. In example embodiments of the present disclosure, the state recovery circuit may comprise mostly FEOL transistors (flip-flop) distributed throughout the power isle. In example embodiments of the present disclosure, area loss caused by a lot of routing through the interconnect tree may be minimized by implementing the TFT directly on top of the flip-flop.

In example embodiments of the present disclosure, the back-end-of-line portion may comprise metallization layers, and the wake-up/sleep circuit may be implemented in the $3^{rd}$ or higher metallization layer of the back-end-of-line portion.

In example embodiments of the present disclosure, the wake-up/sleep circuit may not be part of the FEOL part of the generic building block (e.g., ALU). The generic building block thereby corresponds with a power isle. The number of transistors required to realize a wake-up/sleep circuit in accordance with embodiments of the present disclosure may depend on the length of the distinct identifier (e.g., for an identifier between 1 and 16 bit, this may be between 20 and 200 transistors). In example embodiments of the present disclosure, this number of transistors can be densely scaled. Notwithstanding the fact that it could be scaled even more when implemented in the FEOL portion, in example embodiments of the present disclosure, the wake-up/sleep circuit may be implemented in the BEOL portion because, in the latter case, no FEOL area is consumed.

In example embodiments of the present disclosure, the wake-up/sleep circuit may be implemented using thin film transistors.

In example embodiments of the present disclosure, the wake-up/sleep circuit may be implemented as TFTs because this may lead to less current consumption than when the wake-up/sleep circuit is implemented in the FEOL.

In example embodiments of the present disclosure, the wake-up/sleep circuit may comprise a bus interface adapted for receiving an identifier. In example embodiments of the present disclosure, the identifiers can be transmitted over a bus system.

In example embodiments of the present disclosure, the integrated circuit device may comprise a plurality of power control units and a central power management module comprising a bus interface, wherein the bus interface of the wake-up/sleep circuit of the power control units and the bus interface of the power management module are connected to a bus, and wherein the power management module is adapted for transmitting the distinct identifiers over the bus.

In example embodiments of the present disclosure, centralized control of the power control units may be possible.

In example embodiments of the present disclosure, the integrated circuit device may comprise a plurality of power control units, wherein the bus interface of the wake-up/sleep circuit of a power control unit is connected to a bus, and wherein neighboring power isles are connected to the same bus.

In example embodiments of the present disclosure, from one power isle it may be possible to turn ON a neighboring power isle by sending the distinct identifier over the bus towards the power control unit of that neighboring power isle. In example embodiments of the present disclosure, only neighboring power control units may be connected over a bus because this limits the number of power control units to the bus and hence also limits the number of bits required for addressing the different power control units. For example, less than 4 bits, less than 3 bits, or even one bit may be sufficient. In example embodiments of the present disclosure, some of the power control units may be controlled by a power management module, and other power control units may be controlled by their neighboring power isles. Depending on the functionality, some power control units may be better controlled locally and other power control units may be better controlled centrally.

Example aspects of the present disclosure are set out in the accompanying independent and dependent claims. Features from the dependent claims may be combined with features of the independent claims and with features of other dependent claims as appropriate and not merely as explicitly set out in the claims.

These and other aspects will be apparent from and elucidated with reference to the embodiment(s) described hereinafter.

DETAILED DESCRIPTION

Figure 1:
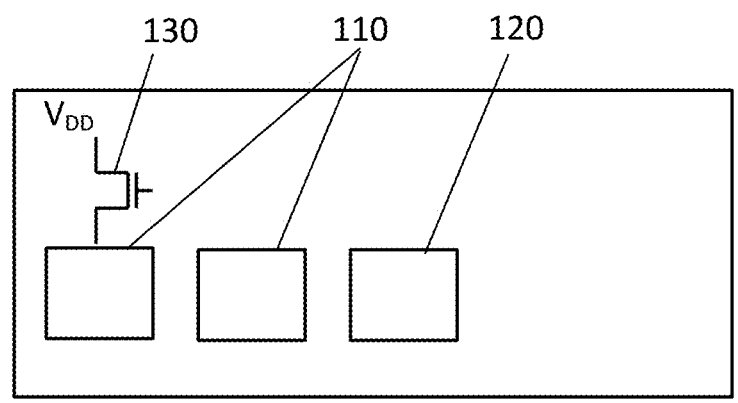
FIG. 1 shows an integrated circuit comprising different units implemented in the front-end-of-line portion of the IC.

Aspects of the present disclosure will be described with respect to particular embodiments and with reference to certain drawings, but the disclosure is not limited thereto. The drawings described are only schematic and are non-limiting. In the drawings, the size of some of the elements may be exaggerated and not drawn to scale for illustrative purposes. The dimensions and the relative dimensions may not correspond to actual reductions to practice.

The terms first, second, and the like in the description and in the claims, are used for distinguishing between elements and not necessarily for describing a sequence, either temporally, spatially, in ranking, or in any other manner. It is to be understood that the terms so used are interchangeable under appropriate circumstances and that the embodiments of the disclosure described herein are capable of operation in other sequences than described or illustrated herein.

Moreover, the terms top, under, and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps, or components as referred to, but does not preclude the presence or addition of one or more other features, integers, steps, components, or groups thereof. Thus, the scope of the expression "a device comprising components A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures, or characteristics may be combined in any suitable manner, as would be apparent from this disclosure, in one or more embodiments.

Similarly, it should be appreciated that in the description of example embodiments of the disclosure, various features of the disclosure are sometimes grouped together in a single embodiment, figure, or description thereof for the purpose of streamlining the disclosure and aiding in the understanding of one or more of the various aspects. This method of disclosure, however, is not to be interpreted as reflecting an intention that the claimed embodiment requires more features than are expressly recited in each claim. Rather, as the following claims reflect, various aspects may include less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures, and techniques have not been shown in detail in order not to obscure an understanding of this description.

Where, in embodiments of the present disclosure, reference is made to "the front-end-of-line portion (FEOL)" of an integrated circuit (IC) device, reference is made to that portion of the IC device that comprises a processed semiconductor substrate, provided with a plurality of active and/or passive components, such as transistors and other devices, obtained by or obtainable by processing a semiconductor wafer (e.g., lithography/etch, shallow trench isolation, N+/P+ implants, and gate deposition).

Where, in embodiments of the present disclosure, reference is made to the "back-end-of-line portion (BEOL)" of an IC device, reference is made to that portion of the IC device that comprises a sequence of metallization layers for establishing current paths between the FEOL portion and external terminals to which the IC is connected.

The present disclosure provides an integrated circuit comprising at least one power control unit for controlling the power of a power isle. A power isle is a sub-region in the IC of which the power can be switched OFF separately. A power isle can, for example, be a µcore comprising between $10^5$ and $10^7$ transistors, an ALU having between $10^3$ and $10^4$ transistors, or even a simple adder having as few as $10^2$-$10^3$ transistors, or a combination of such units.

In embodiments of the present disclosure, a power control unit may comprise a power gating switch adapted for switching OFF/ON the supply voltage to the power isle, a state recovery circuit adapted for storing/restoring the state of the power isle, and a wake-up/sleep circuit for controlling operation of the power gating switch and the state recovery circuit. For that purpose, the wake-up/sleep circuit may be operatively connected with the power gating switch and with the recovery circuit.

Figure 2:
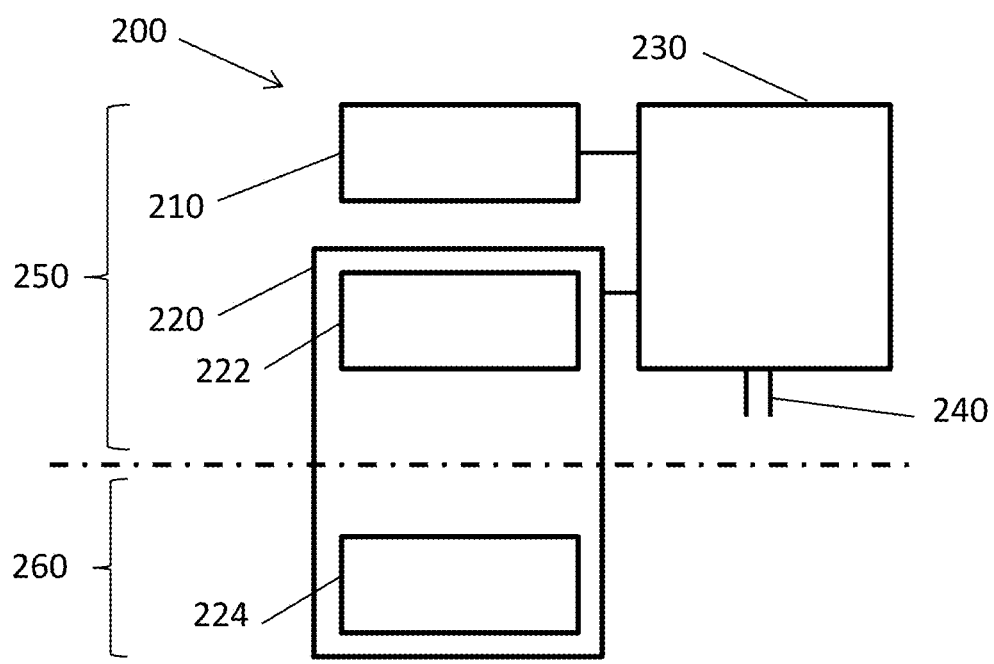
FIG. 2 shows a schematic overview of a power control unit, according to an example embodiment.

A schematic overview of such a power control unit 200, which is configured for switching ON or switching OFF the supply voltage to a power isle, is shown in FIG. 2. It shows an upper, BEOL portion 250 and a lower, FEOL portion 260 of the IC device 200. Components implemented in the BEOL portion 250 may include the power gating switch 210, part 222 of the state recovery circuit 220, and the wake-up/sleep circuit 230; the present disclosure, however, is not limited to such a configuration. This wake-up/sleep circuit 230 implemented in the BEOL portion 250 of the IC device 200 may have a distinct identifier. The wake-up/sleep circuit 230 may be addressable through a bus system over a bus interface 240. Upon receipt of its distinct identifier, the wake-up/sleep circuit 230 may drive the power gating switch 210 for powering up or powering down the isle. The same or different identifiers may be used for powering up and powering down. The identifier length may depend on the number of wake-up/sleep circuits 230, which may need to be differentiated by their distinct identifiers. The length of the identifier may for example be between 1 and 16 bits.

In embodiments of the present disclosure, the wake-up/sleep circuit 230 may comprise a bus interface 240 adapted for receiving an identifier. This interface 240 may, for example, be a serial bus interface.

The power gating switch 210 may be suitable for switching ON or OFF the power to the power isle. The power gating switch 210 may be implemented in the BEOL portion 250 of the IC device.

The state recovery circuit 220 on the one hand comprises a memory element 224, and on the other hand a transistor configuration 222. In embodiments of the present disclosure, the memory element 224 of the state recovery circuit 220 may comprise a flip-flop for each state to be remembered. This flip-flop may comprise transistors implemented in the FEOL portion 260 of the integrated circuit or in the BEOL portion 250 of the integrated circuit. In embodiments of the present disclosure, the transistor configuration 222 may comprise, in the BEOL, one or more TFTs in a DRAM configuration as part of the flip-flop, and this TFT may have a low leakage rate. For example, when semiconductor material of the TFT is indium gallium zinc oxide (IGZO), the TFT may have an OFF current $I_{off}$=$10^{-23}$ A/µm. Such a low leakage may permit maintaining the state in the state recovery circuit 220 over several months without a refresh being required.

In embodiments of the present disclosure, the state of a power isle may be continuously stored in the BEOL portion of the power isle. In that case, there may be no delay when a power isle is powered OFF. When, in embodiments of the present disclosure, a power isle is powered ON again, the state recovery circuit 220 may recover the stored state and subsequently restart operation. The minimal delay of such a restart operation may be half a clock cycle. Depending on the design (internal or external memory, SRAM, DRAM) or technology (e.g., RC-constants), larger delays may be possible.

Figure 3:
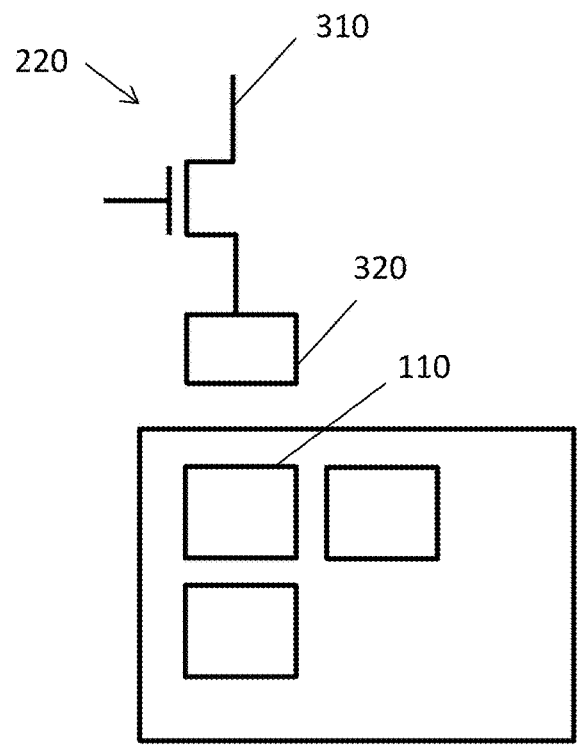
FIG. 3 shows a schematic overview of a state recovery circuit, according to an example embodiment.

FIG. 3 shows a schematic example of a state recovery circuit 220 according to an example embodiment of the present disclosure. In this example, the transistor configuration 222 may be formed by a TFT 310. In this example, the memory element may be a D-flip-flop 320. This D-flip-flop configuration may, for example, comprise 45 transistors in the FEOL portion 260 and 1 TFT transistor in the BEOL portion 250. In embodiments of the present disclosure, the state recovery circuit 220 may be a flip-flop (static) or SRAM cell, whereby at least 1 transistor is a TFT in the BEOL combined with a capacitor working together like in DRAM. The other transistors can either be in FEOL or BEOL. The overall number of transistors may therefore dependent on the specific design of the state recovery circuit 220.

In embodiments of the present disclosure, the TFT of the transistor configuration 222 of the state recovery circuit 220 may be implemented in the M1-M3 metallization layers of the BEOL portion 250. This may be a TFT with very low OFF current implemented in the BEOL process flow in between different metallization layers. The state recovery circuit 220 may comprise a flip-flop in FEOL transistors and 1 or more TFTs in a DRAM configuration as part of the flip-flop in M1-M3 for every state that is to be maintained. In these embodiments, the TFT used for power gating may be implemented in any intermediate metallization level (e.g., M4-M6), and the wake-up/sleep circuit 230 may be implemented in the upper metallization level (e.g., M7-M12). This is only an example, and the number of metallization levels and the position of the TFTs may vary. A possible positioning may be, going from closest to the FEOL portion 260 to furthest from the FEOL portion 260, first the transistor configuration 222 of the state recovery circuit 220, next the power gating switch 210, and next the wake-up/sleep circuitry 230. In embodiments of the present disclosure, the power isle may comprise a sub-circuit (e.g., 100-10000 FEOL transistors of an adder or ALU) which may be a design library instance. This may be a black-box including M1-M3 licensed from a design house. The state recovery circuit 220 may be part of this instance. For such a power isle the power gating switch 210 may be implemented above M3, e.g., M4-M6, and may be implemented such that it can switch the whole power isle OFF. In embodiments of the present disclosure, the wake-up/sleep circuit 230 may always be active since it controls the power distribution. In some embodiments, the wake-up/sleep circuit 230 may be more energy efficient at the cost of performance. Further, the footprint of the wake-up/sleep circuit 230 may be no larger than the size of the power isle, which comprises the sub-circuit (e.g., an ALU).

Figure 4:
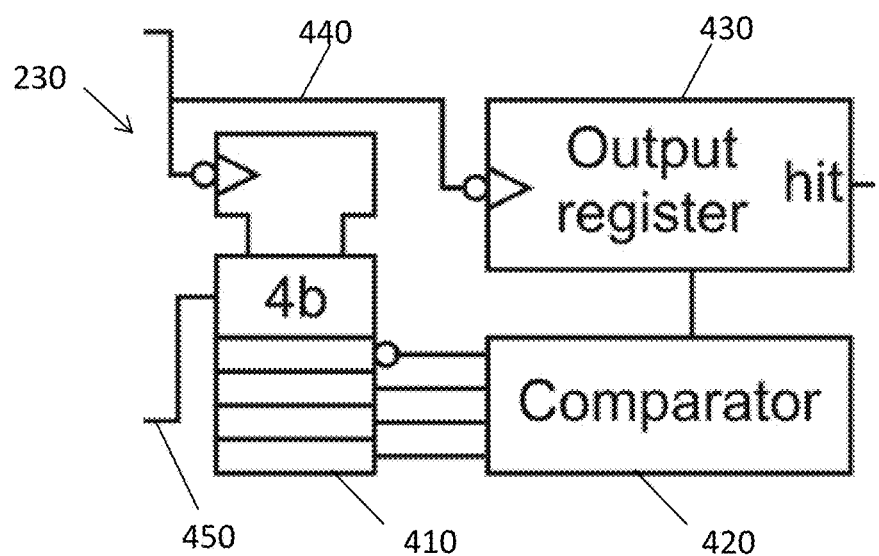
FIG. 4 shows a possible implementation of a wake-up/sleep circuit, according to an example embodiment.

FIG. 4 shows a possible implementation of a wake-up/sleep circuit 230 according to an example embodiment of the present disclosure. In this example, the wake-up/sleep circuit 230 comprises a 4-bit register 410 adapted for storing a 4-bit identifier; the present disclosure, however, not being limited thereto. A bus-system may be used for transmitting the identifier to the wake-up/sleep circuit 230. Upon receipt thereof, the identifier may be stored in the 4-bit register. The wake-up/sleep circuit 230 may also comprise a comparator 420 for comparing the stored identifier with a pre-defined distinct identifier. When both are equal, this is indicated to the output register 430, resulting in a state change. In an example embodiment, the output register 430 may be a T-flip-flop. In this case, the register changes state each time the code is sent. In this way, the same code can be sent for going to sleep and for waking up. In this example, the wake-up/sleep logic may be controlled by two lines—a clock line 440 and a code line 450. The clock line may be connected to both the shift register 410 and the output register 430. Upon occurrence of a hit, the wake-up/sleep circuit 230 may drive the state recovery circuit 220 for storing or restoring the current state of the power isle, and switches the power gating switch 210 (e.g., power gating TFT) for switching OFF or ON the supply voltage to the power isle. In this example, the current state is, during operation, constantly copied in the state recovery registers. As a result thereof, no delay may occur when a power isle (e.g., a logic block) is turned OFF. The opposite transfer of the state in the state recovery circuit 220 towards the FEOL may be initiated by the initiation of the power isle (e.g., the logic block).

Figure 5:
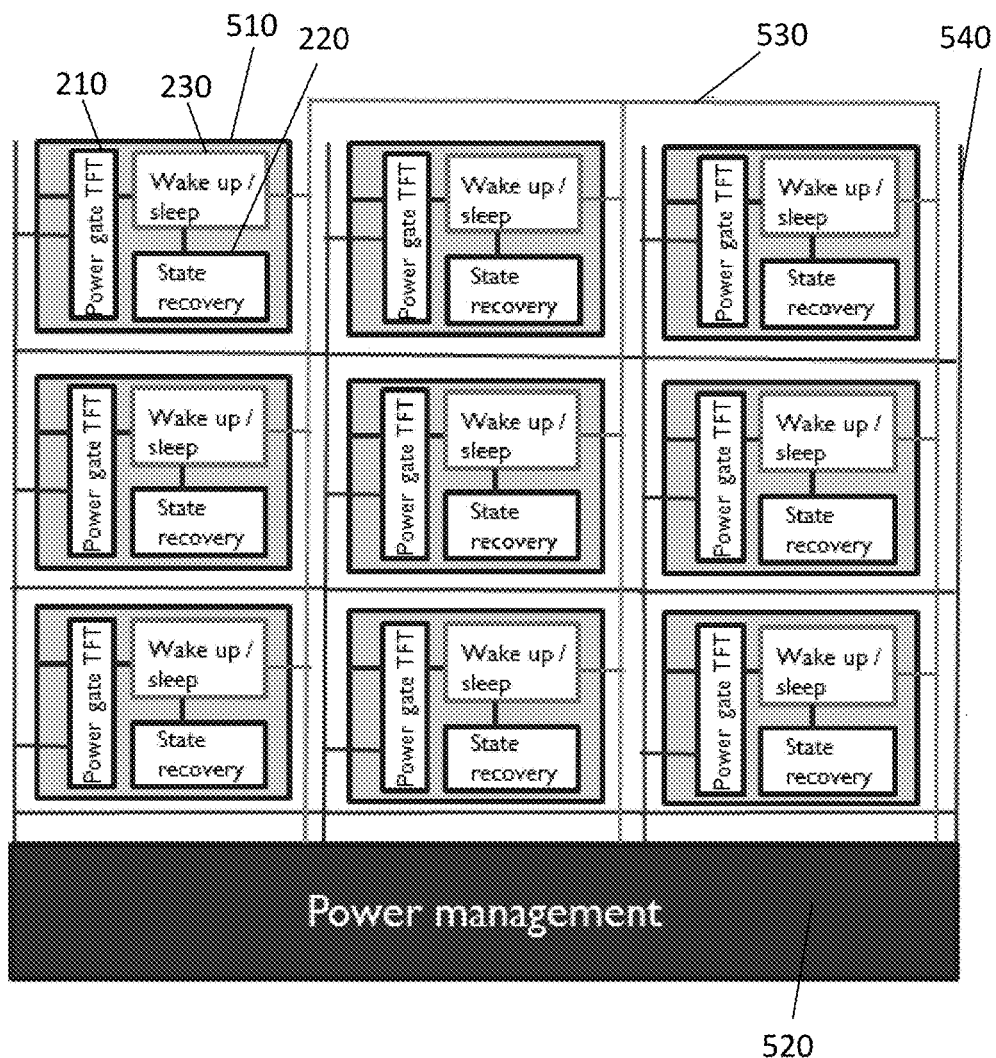
FIG. 5 shows a schematic overview of a power control system comprising a plurality of power control units with centralized activity control, according to an example embodiment.

FIG. 5 shows a power control system comprising a plurality of power control units with centralized activity control according to an example embodiment of the present disclosure. FIG. 5 shows a plurality of power isles 510, each having a respective power control unit. Each power control unit may comprise a power gating switch 210, which in this case, for example, is a power gate TFT. Each power control unit moreover may comprise a state recovery circuit 220 and a wake-up/sleep circuit 230. VDD lines 540, coming from a power management module 520, may be connected to each of the power gating switches 210. Each wake-up/sleep circuit 230 may be controlled by a central power management module over a bus 530. This may, for example, be a serial bus. By addressing a particular wake-up/sleep circuit 230 over the bus system, it is possible to operate the state recovery circuit 220, so as to restore/store the state of the isle 510, and the power gating switch 210, so as to switch ON/OFF the power to the power isle 510. A distinct identifier, identifying the particular wake-up/sleep circuit 230 to be controlled, may be supplied to all wake-up/sleep circuits 230 in the system through a serial bus system. The length of the distinct identifier may therefore depend on the number of power isles 510 that need to be switched OFF independently in the integrated circuit (e.g., the distinct identifier may be a 16 bit identifier if thousands of power isles 510 are required). Centralized control may be useful in mobile applications, as it may result in power saving. For example, the central core of a mobile phone may always be ON, such that the central demand in mobile application may be low energy consumption.

Depending on the usage pattern, the power control system may switch OFF unused areas of the IC and external components. The overall duty cycle of the most sub-circuits and components may be very low (<1%), which may make power gating more beneficial. The use of BEOL TFT for power gating combined with the fast state recovery (flip-flop with IGZO TFT as DRAM) allows a more fine-grained power gating. Furthermore, it may not be necessary to recover the previous state from an external memory, which may also save energy as well.

Figure 6:
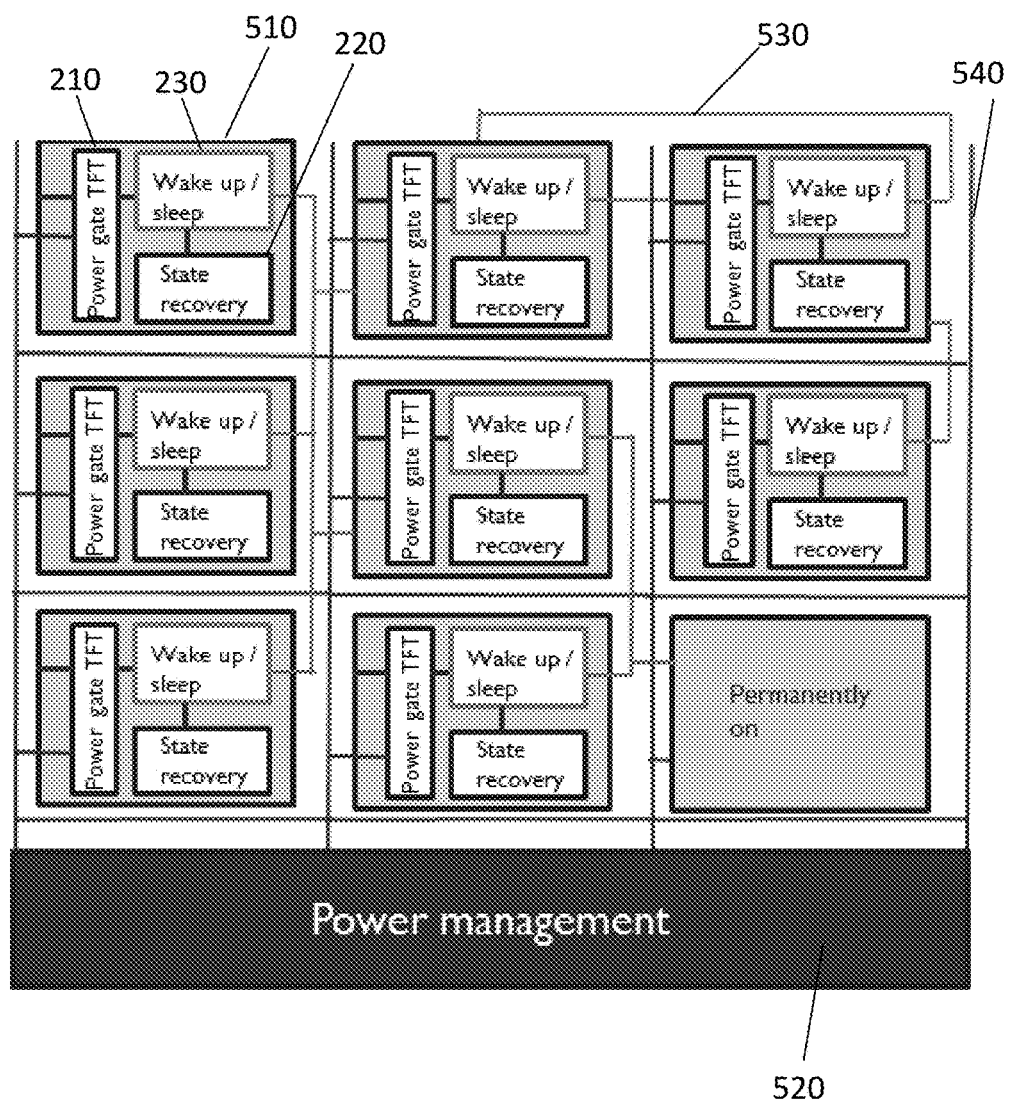
FIG. 6 shows a schematic overview of a power control system comprising a plurality of power control units with decentralized activity control, according to an example embodiment.

FIG. 6 shows a power control system comprising a plurality of power control units with decentralized activity control according to an example embodiment of the present disclosure. FIG. 6 shows a plurality of power isles 510, each (except for one, which is permanently on) having their own power control unit. The power control units may be the same as those in FIG. 5. Also, here the VDD lines 540, coming from the power management module 520, may be connected to each of the power gating switches 210. In this example embodiment of the present disclosure, a wake-up/sleep circuit 230 may be controlled by neighboring power isles over a bus 530. For functioning, a given power isle may, for example, comprise a µcore, an ALU, or an adder. If results from a neighboring power isle are required, the given power isle may address the power control unit of the neighboring power isle, thereby switching ON the neighboring power isle. Because in this case only the neighboring power isles need to be addressed, an identifier with a length between 1 and 4 bits may be sufficient.

Distributed control may be useful in server applications as it may result in energy saving (e.g., for the same computation less energy is required). A server may have a high-duty cycle, and the central concern may be speed and power consumption more than actual energy consumption. Too much power consumption may heat up the IC. This might impose that certain silicon areas should not be used, because when they are used the silicon die could become too hot.

When placing the power control system on many fine-grained power isles and letting the activation be decided by neighboring sub-circuits, the activation may be dynamically adjusted based on the output of a previous operation. Since the number of bits for the wake-up circuit identifier is lower, and since the bits for the wake-up circuit do not go through a central power management circuit with a bus system, the reaction time of this power control may be faster and can be more widely used.

Figure 7:
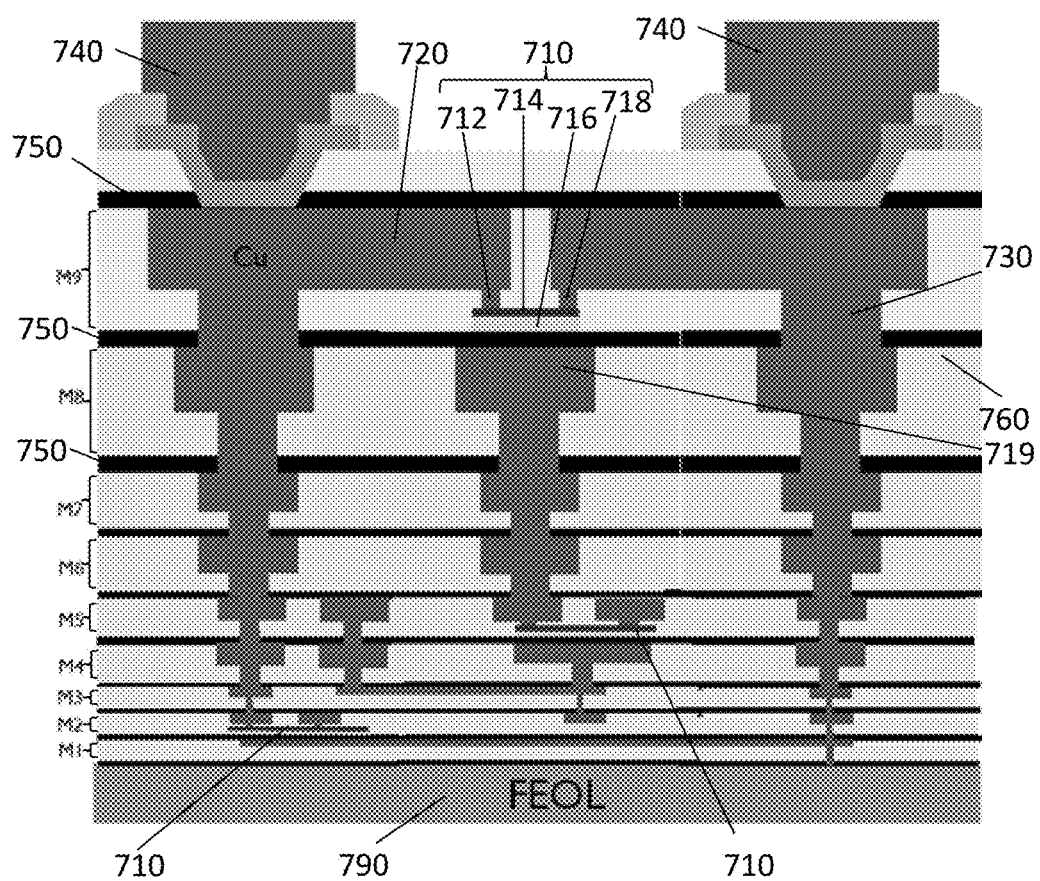
FIG. 7 shows a schematic drawing of a BEOL portion on top of a FEOL portion of an IC device, according to an example embodiment.

FIG. 7 shows a schematic cross-sectional drawing of a BEOL portion on top of a FEOL portion 790 of an IC device according to an example embodiment of the present disclosure. The FEOL portion 790 is schematically illustrated as a rectangle, without showing any detail. With regard to the BEOL portion, the drawing shows a number of metallization layers M1 to M9 above each other. Metal, e.g., copper, contact bumps 740 may be in electrical contact with the upper metallization layer M9. Dielectric layers 750 may be present between the metallization layers M1-M9. Metal lines 720 may be interconnected by metal interconnects 730.

The metal lines 720 and interconnects 730 may be embedded in a layer of dielectric material (e.g., $SiO_2$). In this example, layer 750 between the metallization layers also is a dielectric layer (e.g., SiCN).

As shown in FIG. 7, transistors 710 may be integrated between a pair of two metallization layers of the BEOL portion of an IC device. These may be TFTs of the power gating switch 210, of the transistor configuration 222, and of the wake-up/sleep circuit 230.

Embodiments of the present disclosure may, for example, comprise a transistor in the BEOL portion wherein the gate 719, source 712, and drain 718 electrodes of the transistor are formed by metal lines or metal-filled interconnects present within the metallization layers of the BEOL portion. The channel region 714 may be in the form of a planar layer of a semiconductor material, and in the illustrated example, the gate 719 may comprise a planar layer 716 of a suitable gate dielectric material and the dielectric layer 750. In embodiments of the present disclosure, the semiconductor layer 714 may be a thin film semiconductor layer deposited during BEOL processing, enabling production of transistors with low leakage in the BEOL. The term thin film semiconductor refers to semiconductor material that can be deposited in the form of a layer onto a supporting interface. The semiconductor material can, for example, be indium gallium zinc oxide (IGZO). The term IGZO encompasses all realizable varieties of the compound $In_xGa_yZn_zO_w$ in terms of the values of the atomic numbers x, y, z, and w. One such example of IGZO is $In_2Ga_2ZnO_7$. Using IGZO as semiconductor material may allow a transistor to be implemented with a short turn-on and turn-off time because of the low threshold voltage of the transistor. As can be seen in FIG. 7, transistors 710 may be present at different levels in the BEOL portion.

What is claimed is:

1. An integrated circuit device comprising:
   a front-end-of-line portion;
   a back-end-of-line portion; and
   a power control unit for controlling a supply power of a power isle in the front-end-of-line portion, the power control unit comprising:
      a power gating switch implemented in the back-end-of-line portion, wherein the power gating switch is configured to switch ON or OFF the supply power to the power isle;
      a state recovery circuit configured to store and restore a state of the power isle, wherein the state recovery circuit comprises (i) at least one memory element implemented in the front-end-of-line portion or back-end-of-line portion and (ii) a transistor configuration in the back-end-of-line portion; and
      a wake-up/sleep circuit implemented in the back-end-of-line portion and configured to receive an identifier, wherein the wake-up/sleep circuit is operatively connected with the power gating switch and with the state recovery circuit, and wherein the wake-up/sleep circuit is configured to perform a wake-up/sleep process in response to receiving the identifier, the wake-up/sleep process comprising at least one of:
         (i) causing the power gating switch to switch OFF the supply power to the power isle and causing the state recovery circuit to store a state of the power isle, or
         (ii) causing the power gating switch to switch ON the supply power to the power isle and causing the state recovery circuit to restore the state of the power isle.

2. The integrated circuit device of claim 1, wherein the transistor configuration in the back-end-of-line portion is connected with the memory element such that the transistor configuration reduces current leakage through the memory element.

3. The integrated circuit device of claim 1, wherein the back-end-of-line portion comprises metallization layers and wherein the power gating switch comprises a thin-film transistor in between at least two of the metallization layers of the back-end-of-line portion.

4. The integrated circuit device of claim 1, wherein the back-end-of-line portion comprises at least three metallization layers, and wherein the power gating switch comprises a thin-film transistor implemented above the 3rd metallization layer of the back-end-of-line portion when starting to count the metallization layers from the front-end-of-line portion.

5. The integrated circuit device of claim 1, wherein the at least one memory element of the state recovery circuit comprises a flip-flop comprising front-end-of-line transistors in the power isle, and wherein the transistor configuration in the back-end-of-line portion comprises a thin-film transistor directly on top of the flip-flop.

6. The integrated circuit device of claim 1, wherein the back-end-of-line portion comprises metallization layers, and wherein the wake-up/sleep circuit is implemented in a 3rd or higher metallization layer of the back-end-of-line portion.

7. The integrated circuit device of claim 1, wherein the wake-up/sleep circuit comprises a plurality of thin-film transistors.

8. The integrated circuit device of claim 1, wherein the wake-up/sleep circuit comprises a bus interface for receiving the identifier.

9. The integrated circuit device of claim 1, further comprising a power management module and a plurality of the power control units, wherein the power management module is connected by a bus to each wake-up/sleep circuit of each power control unit of the plurality of the power control units, and wherein the power management module is configured to transmit the identifier over the bus to each wake-up/sleep circuit of each power control unit of the plurality of the power control units.

10. The integrated circuit device of claim 1, further comprising a plurality of the power control units, wherein the wake-up/sleep circuit of each power control unit of the plurality of the power control units is connected by a bus to one or more neighboring power control units of the plurality of the power control units.

11. An integrated circuit device comprising:
    a front-end-of-line portion;
    a back-end-of-line portion; and
    a plurality of power control units for controlling supply power to a plurality of power isles in the front-end-of-line portion, each power control unit of the plurality of power control units comprising:
       a power gating switch implemented in the back-end-of-line portion, wherein the power gating switch is configured to switch ON or OFF the supply power to a respective power isle of the plurality of power isles;
       a state recovery circuit configured to store and restore a state of the respective power isle, wherein the state recovery circuit comprises (i) at least one memory element implemented in the front-end-of-line portion or back-end-of-line portion and (ii) a transistor configuration in the back-end-of-line portion; and a wake-up/sleep circuit implemented in the back-end-of-line portion and configured to receive an identifier, wherein the wake-up/sleep circuit is operatively connected with the power gating switch and with the state recovery circuit, and wherein the wake-up/sleep circuit is configured to perform a wake-up/sleep process in response to receiving the identifier, the wake-up/sleep process comprising at least one of:
  (i) causing the power gating switch to switch OFF the supply power to the respective power isle and causing the state recovery circuit to store a state of the respective power isle, or
  (ii) causing the power gating switch to switch ON the supply power to the respective power isle and causing the state recovery circuit to restore the state of the respective power isle.

12. The integrated circuit device of claim 11, wherein the transistor configuration in the back-end-of-line portion is connected with the memory element such that the transistor configuration reduces current leakage through the memory element.

13. The integrated circuit device of claim 11, wherein the back-end-of-line portion comprises metallization layers and wherein the power gating switch comprises a thin-film transistor in between at least two of the metallization layers of the back-end-of-line portion.

14. The integrated circuit device of claim 11, wherein the back-end-of-line portion comprises at least three metallization layers, and wherein the power gating switch comprises a thin-film transistor implemented above the 3rd metallization layer of the back-end-of-line portion when starting to count the metallization layers from the front-end-of-line portion.

15. The integrated circuit device of claim 11, wherein the at least one memory element of the state recovery circuit comprises a flip-flop comprising front-end-of-line transistors in the power isle, and wherein the transistor configuration in the back-end-of-line portion comprises a thin-film transistor directly on top of the flip-flop.

16. The integrated circuit device of claim 11, wherein the back-end-of-line portion comprises metallization layers, and wherein the wake-up/sleep circuit is implemented in a 3rd or higher metallization layer of the back-end-of-line portion.

17. The integrated circuit device of claim 11, wherein the wake-up/sleep circuit comprises a plurality of thin-film transistors.

18. The integrated circuit device of claim 11, wherein the wake-up/sleep circuit comprises a bus interface for receiving the identifier.

19. The integrated circuit device of claim 11, further comprising a power management module connected by a bus to the wake-up/sleep circuit of each power control unit of the plurality of the power control units, and wherein the power management module is configured to transmit the identifier over the bus to the wake-up/sleep circuit of each power control unit of the plurality of the power control units.

20. The integrated circuit device of claim 11, wherein the wake-up/sleep circuit of each power control unit of the plurality of the power control units is connected by a bus to one or more neighboring power control units of the plurality of the power control units, and wherein the wake-up/sleep circuit of each power control unit of the plurality of the power control units is configured to receive the identifier over the bus from the one or more neighboring power control units of the plurality of the power control units.

* * * * *